United States Patent [19]
Lamberton et al.

[11] Patent Number: 5,385,629
[45] Date of Patent: Jan. 31, 1995

[54] AFTER ETCH TEST METHOD AND APPARATUS

[75] Inventors: Alan J. Lamberton, Eagle; Rod C. Langley, Boise, both of Id.

[73] Assignee: Micron Semiconductor, Inc., Boise, Id.

[21] Appl. No.: 137,674

[22] Filed: Oct. 14, 1993

[51] Int. Cl.$^6$ .................... H01L 21/306; B44C 1/22; B29C 37/00
[52] U.S. Cl. .................. 156/626; 156/646; 156/668; 156/345
[58] Field of Search ............... 156/626, 627, 643, 646, 156/655, 657, 659.1, 662, 668, 345; 437/8

[56] References Cited
U.S. PATENT DOCUMENTS
4,650,744  3/1987  Amano .................. 156/626 X OTHER PUBLICATIONS
Matrix System One Model 10x Photoresist Stripper, System Specifications, Apr. 27, 1988, by Matrix Integrated Systems Inc, 4131 Lake Side Dr. Richmond Calif. 94806.

Primary Examiner—William Powell
Attorney, Agent, or Firm—Susan B. Collier

[57] ABSTRACT

There is a post etching test apparatus and method to be able to only test just a few die on the wafer. Uniquely, the remainder of the die on the wafer can be salvaged, if the test identifies proper tolerances for the etching process over the entire wafer surface. If the tests show negative, the etch process can be re calibrated and the wafer can be reprocessed and tested again. Salvage of the majority of the die on the wafer under test is possible by using a fine point resist removal plate. Specifically, oxygen is forced over certain die on the wafer to remove the resist mask by using a plate barrier with only a few holes in it. The holes are located a key positions around the wafer, and restrain the oxygen laminar flow to effect only the wafers directly below these holes.

10 Claims, 1 Drawing Sheet

AFTER ETCH TEST METHOD AND APPARATUS

FIELD OF THE INVENTION

The present invention relates to integrated circuits (ICs). Particularly, there is a device that will only test a few die on a wafer, thus preserving the usefulness of the remaining die. Uniquely, these chosen die have the resist stripped after etch to test for the accuracy of the etch phase. Specifically, the testing takes place before any implanting operation.

BACKGROUND OF THE INVENTION

In the production of semiconductor chips there are tests performed to monitor the accuracy of the ongoing fabrication of the individual die on the wafer. The information gained from these tests allow for immediate modification of the fabrication process to keep the specifications within the tolerances allowed. Additionally, these continuous test prevent further fabrication of already defective wafers.

PROBLEMS

A problem arises in the testing of the die on the wafer for compliance with specification standards. In particular, some tests performed will destroy a whole wafer in order to glean the necessary testing information. In particular, testing of specification tolerances in the etching process typically will destroy the selected wafer for testing. Although, there may be one hundred or more wafers being fabricated, any loss of a single wafer is a loss of two hundred or more potential individual integrated circuits selling for a few dollars to hundreds of dollars a piece. Not to mention the amount of work put into the wafer up to that point is now all lost.

In particular, testing of the die on the wafer after an etching process have resulted in a complete destruction of the wafer under test.

Typically, the etching process requires a photoresist mask deposited before the etching process is initiated. Thus, testing requires removing the patterned resist layer. However, the very next fab process requires the same mask to be there for an ion implantation, where by the mask is then removed.

It logically would make sense to do the etch testing after the implantation process and the resist layer is removed. However, the implantation process usually handles many wafers at one time, and the process typically takes five to six hours. Additionally, if the etching process was found to be defective for some reason, there is no way for salvaging these wafers. However, if the testing takes place before the implantation step, all identified defective wafers can be salvaged and reprocessed at that time.

The real problem facing post etching test is that the photoresist mask must be removed for adequate inspection of the etch process. There is a definite need to be able to only test just a few die on the wafer. That way the remainder of the die on the wafer could be salvaged, if the test identifies proper tolerances for the etching process over the entire wafer surface. If the tests show negative, the etch process can be recalibrated and the wafer can be reprocessed and tested again.

It is noted that the above described problems, as well as other problems, are solved through the subject invention and will become more apparent, to one skilled in the art; from the detailed description of the subject invention.

SUMMARY OF THE INVENTION

One skilled in the art will appreciate the advantage of the present invention. Specifically, there is post etching test apparatus and method to be able to only test just a few die on the wafer. Uniquely, the remainder of the die on the wafer can be salvaged, if the test identifies proper tolerances for the etching process over the entire wafer surface. If the tests show negative, the etch process can be re-calibrated and the wafer can be reprocessed and tested again.

Salvage of the majority of the die on the wafer under test is possible by using a fine point resist removal plate. Specifically, oxygen is forced over certain die on the wafer to remove the resist mask by using a plate barrier with only a few holes in it. The holes are located a key positions around the wafer, and restrain the oxygen laminar flow to effect only the wafers directly below these holes.

Other features and advantages of the present invention may become more clear from the following detailed description of the invention, taken in conjunction with the accompanying drawings and claims, or may be learned by the practice of the invention.

Figure 1:
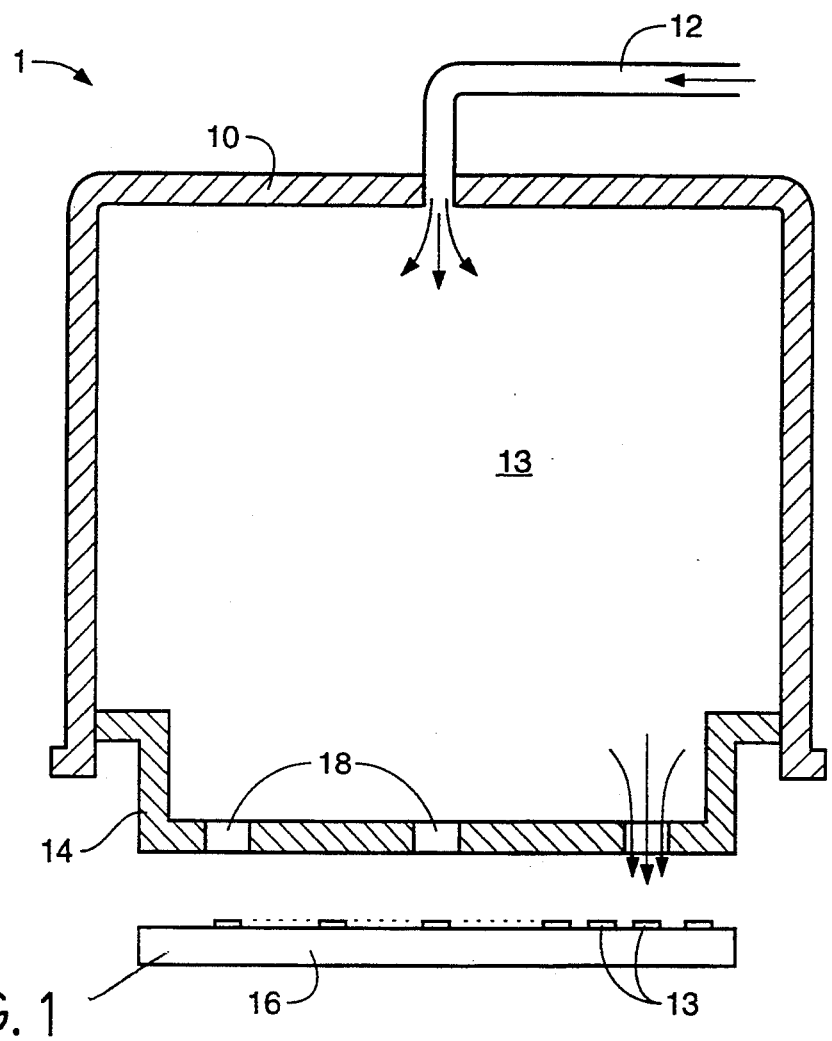
FIG. 1 is a general overall view of the invention.

It is noted that the drawings of the invention are not no scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings, specification, and claims. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arms" (Article 1, Section 8 of the U.S. Constitution).

Incorporated Material

For the purpose of providing background material, which may in some respects illustrate the state of the art, the following books, articles, pamphlets, or data books, are herein incorporated by reference:

Matrix System One Model 10x Photoresist Stripper, System Specifications, Apr. 27, 1988, by Matrix Integrated Systems Inc., at 4131 Lake Side Dr., Richmond, Calif. 94806, (510)222-2727. This is the Company that makes the photoresist mask stripping chamber illustrated in FIG. 1.

General Embodiment

One skilled in the art of etching semiconductors and testing the process will easily understand the operation of a Matrix Target Chamber (MTC, or just chamber) and Fine Point Resist Removal Plate (FPRRP, or just plate) to remove the photoresist (resist) only from selected die on a wafer.

In reference to FIG. 1, there is illustrated the elements of the testing device 1 of current invention, as follows: There is a MTC 10, gas line 12, FPRRP 14 with holes 18, and wafer 16. The MTC 10 and FPRRP form a chamber 13.

Figure 2:
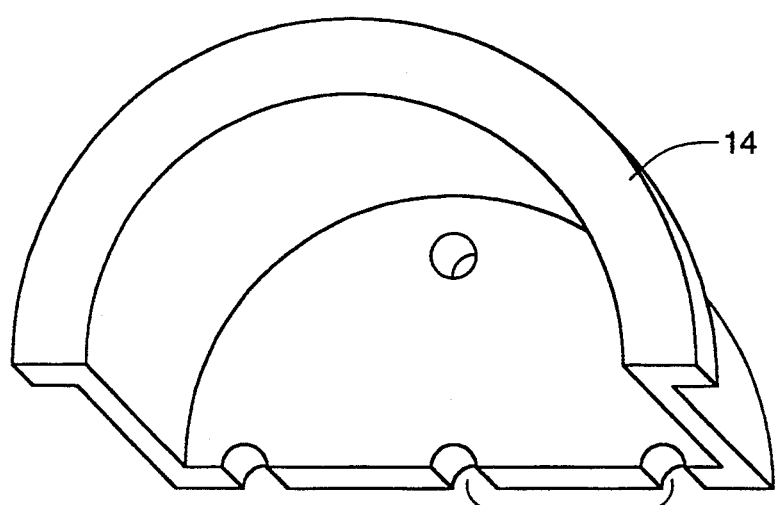
FIG. 2 is a perspective view of half of the fine point resist removal plate.

Referring to FIG. 2, there is illustrated FPRRP 14 with holes 18 in a perspective view.

Operation of the Invention

Someone skill in the art would understand the operation of the invention. Specifically, a selected wafer 16 is placed under the testing device 1. Oxygen (O**2) is introduced into the MTC 10 creating a positive pressure and thereby forcing a laminar oxygen gas stream out of the positioned holes located over selected die on wafer 16.

Photoresist masks are substantially removed at those chosen sites exposed to oxygen. Thereby, the etching results are exposed. Now, the test engineers can inspect the few selected die located at key locations on the wafer. This allows the testers to determine if the etch process of the complete die was within the specified tolerances of quality.

After analysis, If everything is OK, then the selected test wafer is placed back onto the fabrication process line and is now ready to undergo the subsequent steps. Typically, the next fabrication process will be an implantation process.

Only the selected die undergoing the testing will be defective; while the remaining die on the wafer are intact and can be properly used.

After the oxygen resist step is completed, chamber 13 is then filled with nitrogen (N2) to clean out the chamber and bring the chamber back down to atmospheric pressure.

Remarks about the Invention

It is noted that the holes 18 sizes are determined by several factors. For example, the size of the individual die to be tested, the distance between the wafer and the FPRRP 14, and the pressure created in the chamber 13.

It is further noted that, a dry etch process will usually be preferred to test the selected die. Dry etching is less expensive than the typical ash and wet strip process performed after the implantation fabrication step However, one drawback to dry etching is that the resist located over poly and metal will become teflonized, or made very hard. This does not create any problem for the testing of the chosen test die since they are discarded anyway, and the resist located around the etched away material will not create any analysis problems.

It is noted that etch testing is for determining the depth, width, undercut and cross sectional profile of the etch results.

Additionally, for a common DRAM chip it has been found that an ⅛ inch gap and hole size has worked particularly well.

It is noted that 20% or less of the die need to be tested for proper etching specifications.

Additionally, if the tests performed on the selected die are negative, the wafer can be reprocesses to meet the specifications of the etch step. Also, the tests will direct the testers whether the etching process needs to have its operational parameters adjusted before performing further etching operations.

Note, that a typical plate 14 can be purchased from Quartz Int'l. at 8682 S. Sandy Parkway, Sandy, Utah 84070.

Variations in the Invention

There are several obvious variations to the broad invention and thus come within the scope of the present invention. Uniquely, this invention may work with any shape of plate 14, the key results required by the plane is the distance to the wafer and the ability to reach the chosen die to remove the resist in preparation for their testing. Thus, although the drawings show the use of vertically straight holes, these holes can take on any shape. For example, a cone shape will increase the outgoing gas speed and pressure. There may be curtains or barriers hanging down from the bottom side of the plate placed around each hole to keep the stripping gas from contacting adjacent die. It is even conceivable to create holes that have means for varying size of each hole to adapt the plate 14 and holes 18 to a wider variety of wafer and die sizes.

Furthermore, any type of material could be used to make the plate 14 and housing 10.

Uniquely, a plate may not even be used. It is obvious to use tubing or hoses with nozzles pointed at the selected sites. In this fashion, there is no need for a FPRRP 14 or chamber 13, just several hoses 12 pointed at selected die to be resist striped.

While the invention has been taught with specific reference to these embodiments, someone skilled in the art will recognize that changes can be made in form and detail without departing from the spirit and the scope invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any headings.

What is claimed and desired to be secured by United States Patent is:

1. A method of testing quality of an etching of a semiconductor device, comprising the following steps:
   selecting a wafer from a fabrication process that has undergone an etch process;
   removing photoresist from a first portion of die on the wafer to create exposed die, while retaining the photoresist on a second portion of the die on the wafer; and
   performing a quality analysis on etch results of the first portion of the die.

2. The method as specified in claim 1, further comprising the step of continuing a fabrication of said wafer when said etch results are within desired parameters.

3. The method as in claim 1, further comprising the step of modifying the etching process to create a modified etch process which improves the etch results on further wafers exposed to the fabrication process.

4. The method as specified in claim 3, further comprising performing the modified etch process on the wafer when the wafer fails the quality analysis.

5. A method for fabricating a semiconductor circuit, comprising the following steps:

a) providing an etchable layer overlying a semiconductor wafer having a plurality of die;
b) creating a photoresist mask, said photoresist mask exposing portions of said etchable layer in exposed areas;
c) etching said portions of said etchable layer in said exposed areas;
d) removing said photoresist mask from selected die, hereafter known as exposed die, on said wafer; and
e) performing a quality inspection of said exposed die to determine a quality of said etchable layer subsequent to said step of etching.

6. The method as specified in claim 5, further comprising the step of continuing fabrication steps on said semiconductor wafer when said etchable layer has an acceptable said quality.

7. The method as specified in claim 5, further comprising the step of modifying said step of etching to create a modified etch to improve the quality of said etchable layer as determined in said step of performing.

8. The method as specified in claim 7, further comprising performing said modified etch on said wafer.

9. A method for fabricating a semiconductor circuit, comprising the following steps:

a) providing an etchable layer overlying a semiconductor wafer having a plurality of die;
b) creating a photoresist mask, said photoresist mask exposing portions of said etchable layer in exposed areas;
c) etching said portions of said etchable layer in said exposed areas;
d) injecting oxygen to contact said photoresist mask on selected said die of said plurality of said die;
e) removing said photoresist mask from said selected die, hereafter referred to as exposed die, in response to said step of injecting; and
f) performing a quality inspection of said exposed die to determine a quality of said etchable layer subsequent to said step of etching.

10. An apparatus for determining a quality of an etchable layer on a semiconductor wafer having a plurality of die, comprising:

a) a chamber for receiving a photoresist etchant; and
b) a means for directing said etchant from said chamber to a portion of said die of said plurality, said means for directing protecting remaining said die of said plurality from said etchant.

* * * * *